United States Patent [19]

Bois

[11] 4,303,694
[45] Dec. 1, 1981

[54] METHOD AND DEVICE OF DEPOSITION THROUGH VACUUM EVAPORATION MAKING USE OF A MODULATED ELECTRON BEAM AND A SCREEN

[76] Inventor: Daniel Bois, 9, rue de la Grange, 38240 Meylan, France

[21] Appl. No.: 145,727

[22] Filed: May 1, 1980

[30] Foreign Application Priority Data

May 4, 1979 [FR] France ............................... 79 11311

[51] Int. Cl.³ .......................................... C23C 13/12
[52] U.S. Cl. .................................... 427/42; 118/723; 118/726; 427/248.1
[58] Field of Search ...................... 427/42, 248.1, 250, 427/91, 87; 118/723, 726; 219/121 EE, 121 EV, 121 EW

[56] References Cited

U.S. PATENT DOCUMENTS 3,333,982 8/1967 Horn et al. ......................... 118/726

FOREIGN PATENT DOCUMENTS 52-65783 5/1977 Japan ................................. 118/726

Primary Examiner—John H. Newsome

[57] ABSTRACT

A method and device for depositing through vacuum evaporation. In a first step of said method, and in order to deposit a material on the substrates, the latter is placed in a vacuum enclosure opposite a target of the said material then the target is bombarded by means of an electron-beam; in the subsequent steps, the said beam is modulated and a screen opaque to X-rays is moved between the target and the substrate in synchronism with said modulation, in such manner that said screen be permanently placed between said substrates and the target impact area, and that said substrates be directly seen only from those areas of the target that have just been bombarded.

4 Claims, 1 Drawing Figure

U.S. Patent
Dec. 1, 1981
4,303,694
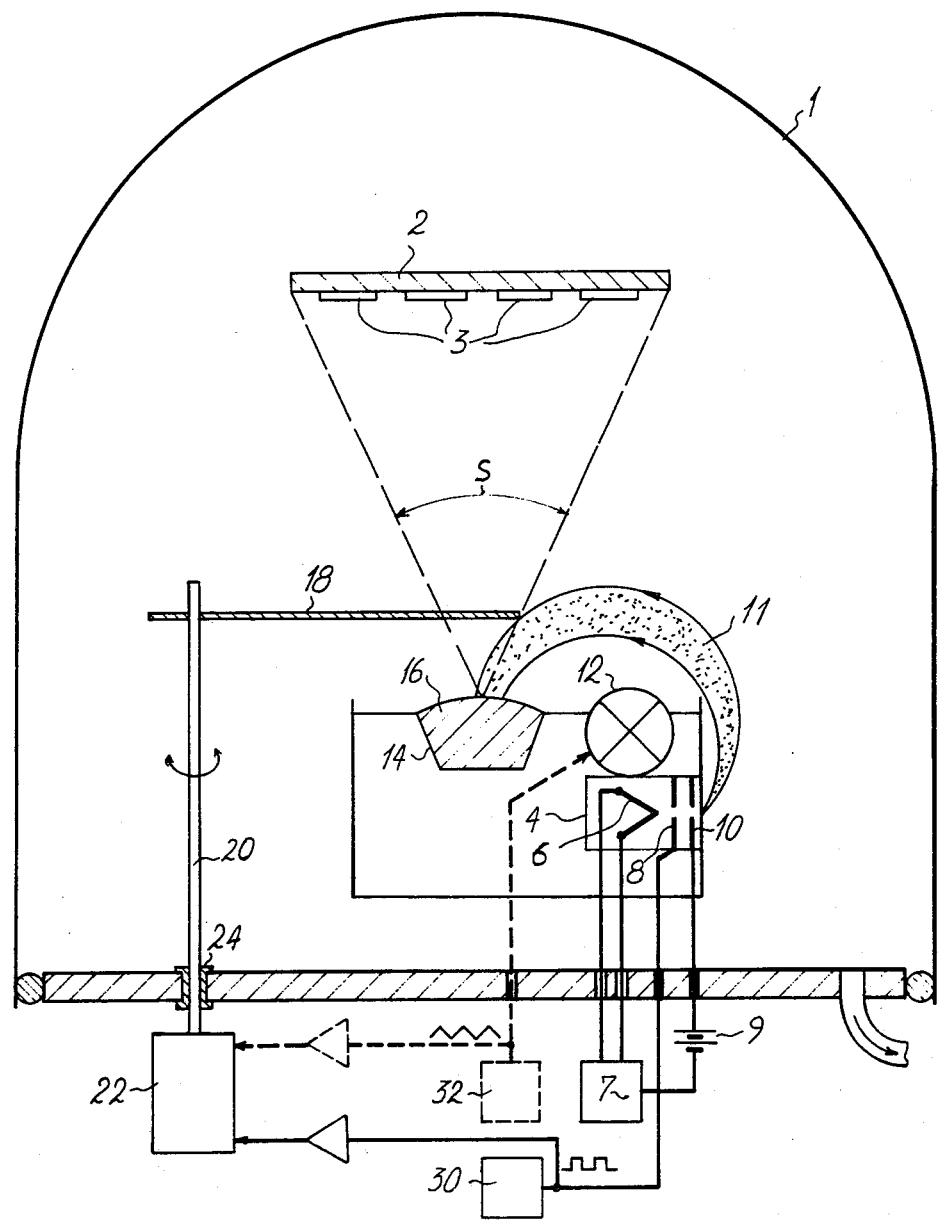

METHOD AND DEVICE OF DEPOSITION THROUGH VACUUM EVAPORATION MAKING USE OF A MODULATED ELECTRON BEAM AND A SCREEN

The present invention relates to a method and a device of deposition through vacuum evaporation. It has an application in the manufacture of electronic components, either discrete or integrated.

The metalization steps required for manufacturing the gates of MOS-transistors (Metal-oxide-Semiconductors) or the electrical connections of integrated circuits, are achieved mainly according to the following three methods:

vacuum evaporation by means of crucibles heated by Joule effect or by high frequency. This is indeed a contaminating method, difficult to carry out for numerous reasons (in particular because of the possible rupture of the crucibles);

vacuum evaporation by means of an electron gun, suitable for all materials. The main drawback of that method lies in that the electron beam generates intense X-rays likely to irradiate the substrate on which depositions are made. In the case of the MOS or SOS (Silicon on Sapphire) methods, the metalization steps must be carried out on $SiO_s$- or $Al_2O_3$-layers and the presence of X-rays is therefore a severe drawback, since these rays generate defects in the insulators ($SiO_2$ or $Al_2O_3$) and at the silicon-$SiO_2$ or silicon-$Al_2O_3$ interfaces. Such defects have the drawback to alter the electrical features of the components thus obtained;

cathode sputtering: the main drawback of this third method lies in that the substrate, simultaneously with the expected deposition, receives ions or electrons that have been accelerated in the sputtering plasma. As in the previous method, defects are generated in the substrate whether the latter is of a semi-conductor material (silicon) or of an insulating material ($SiO_2$).

Of the above three methods, the second one is, now and by far, the most widely used, both at the stage of research and at the stage of manufacture; this is mainly due to the fact that it is a very easily carried out method. However, other solutions are now under investigation in the hope of avoiding the noxious effects of X-rays.

The object of the present invention is precisely to provide a method and a device that are exempt from such a drawback, since they permit to prevent the substrate from being irradiated by the X-rays generated by the electron bombardment.

The present invention therefore represents an improvement over the above method.

The favorable result provided by the present invention is achieved by modulating (in intensity or position) the electron beam and using a movable screen, the movements of which are in timed-relationship with the electronic modulation, so that the substrates never "see" the impact point of the electron beam on the target to be evaporated. The modulation frequency is selected sufficiently large for allowing the evaporation to occur merely through the thermal inertia of the bath, i.e. during the provisional absence of electronic bombardment, therefore when no X-rays are generated.

The present invention can be applied to the manufacture of electronic components of any type: in the technique of the Metal-Oxide-Semiconductor-type in particular; for the manufacture of integrated circuits with a very large scaled integration (VLSI) requiring crystalline properties better than those obtained at present on a commercial scale.

More specifically, the object of the present invention is to provide a method of deposition through vacuum evaporation, said method comprising the steps of, first, in order to deposit a material on the substrates, placing the latter in a vacuum enclosure opposite a target of the said material and bombarding said target by means of an electron beam, modulating the said beam and moving a screen opaque to X-rays between said target and said substrate in synchonism with said modulation, in such manner that said screen be permanently placed between said substrates and the target impact-area and that said substrates be directly seen only from those areas of the target that have just been bombarded.

According to a first variant of said method, said electron beam is modulated in intensity, on an "on-off" basis, said screen is interposed between said target and said substrates during the time-intervals when there is a beam, and said screen is retracted during those time-intervals when there is no beam.

According to a second variant of said method, the electron beam is modulated in position, the impact area of said beam scanning said target periodically, and said screen is moved in synchronism while being permanently scanned between said impact area and said substrates.

Another object of the present invention is to provide a device of deposition through vacuum evaporation, permitting to carry out the above method, said device comprising, in a vacuum enclosure, substrates mounted opposite a target made from said material to be evaporated and an electron gun turned towards said target, means for modulating said beam and a screen opaque to X-rays, said screen being integral with a driving means controlled in synchronism with the modulation of said beam, in such manner that said screen be permanently interposed between said substrates and the beam impact-area and said target, and that said substrates be directly seen only from those areas of said targets that have just been bombarded.

According to a first embodiment, said means for modulating said electron beam is a means for modulating in intensity on an "on-off" basis, and said means for driving said screen is adapted to place the latter between said target and said substrates during those time-intervals when there is a beam and retracts said screen during those time-intervals when there is no beam.

According to a second embodiement, said means for modulating said electron beam is a means adapted to deflect said beam, and said means for driving said screen achieves a position control that permanently places said screen opposite the impact area on said target.

Other features of the present invention will appear from the following description, given merely by way of example, with reference to the sole FIGURE, diagramatically representing a device according to the invention.

The device such as shown in said FIGURE comprises:
 a vacuum enclosure 1;
 a base-plate 2 bearing the substrates 3 to be treated;
 an electron-gun 4 comprising a filament 6, a wehnelt-grid 8 and an anode 10, said gun generating an electron beam 11;

a unit 12 for deflecting said beam 11, said unit consisting e.g. in an electromagnet;

a crucible 14 containing material 16 to be evaporated;

a movable screen 18, integral with a rotating spindle 20 driven by a motor 22 through the medium of a passage-way under vacuum 24. Said screen is so designed as to fully hide solid angle 5 defined by the beam impact point and the substrate-bearing base-plate 2. Said screen is of a heavy material capable of interrupting X-rays, said material being also refractory in order to be able to withstand temperature rises resulting from the bath radiation. Molybdenum is specially suitable in this connection.

Said device further comprises electronic feed and polarization electronic means, viz:

a source 7 of alternating or direct voltage for heating said filament 6;

a source 9 of direct voltage for polarizing anode 10;

in the case of an intensity-modulated beam, a generator 30 adapted to deliver square-wave voltages to be applied to wehnelt-grid 8 and also, after amplification, to motor 22;

in the case of a position-modulated beam, a generator 32 adapted to deliver saw-tooth signals to be applied to the unit for deflecting beam 12 and, once amplified, to motor 22.

The device according to the present invention operates as follows.

Two cases should be considered, depending on the crucible-size:

(1) crucibles of small diameter (about 10 mm):

The impact of electrons on the bath should be fully interrupted. This is achieved by modulating the beam at the exit of the electron gun, by means of the voltage pulses delivered by generator 30 and applied to wehnelt-grid 8. The modulation-frequency (f), the pulse duration (d) and the height thereof (V) should preferably be adjustable in the following ranges:

f between 0.1 and 10 Hz, d between 10 s et 0.1 s,

V between 0 and 500 V.

In such a case, screen 18 is retracted whenever the beam is off, or extinguished, and conversely.

The evaporation speed loss is proportional to ratio d/T, T being the modulation period.

(2) Crucibles of large diameter (above 10–20 mm):

With a view to reducing the mean power loss induced by the beam modulation, it is preferable to resort to a position-modulation of said beam. Electron - beam 11 then scans target 16 by means of saw-tooth signals feeding the winding of the electromagnet 12 for deflecting said beam. Screen 18 moves in synchronism in front of the impact point of said beam, by means of a position servo-device piloted by the position-control voltage. In the first case, all the electric parameters should preferably be adjustable.

The thermal inertia of the bath is dependent on the material to be evaporated, on the crucible size and on the nature thereof. In practice, the frequency-range covered by the apparatus is sufficient for most materials.

What is claimed is:

1. A method of depositing through vacuum evaporation, said method comprising the steps of, first, in order to deposit a material on substrates, placing said substrates in a vacuum enclosure opposite a target of the said material; bombarding said target by means of an electron-beam; modulating said beam on an "on-off basis"; moving a screen, opaque to X-rays, between said target and said substrate in synchronism with said modulation; said screen being interposed between said target and said substrates during those time-intervals when there is a beam, said screen being retracted during those time-intervals when there is no beam.

2. A method of depositing through vacuum evaporation, said method comprising the steps of, first, in order to deposit a material on substrates, placing said substrates in a vacuum enclosure opposite a target of the said material; bombarding said target by means of an electron-beam; modulating said beam in position; said beam having a scanning impact area on said target; moving a screen, opaque to X-rays, between said target, said screen being permanently placed between said target impact area and said substrates.

3. A device of deposition through vacuum evaporation, said device comprising, in a vacuum enclosure, means for mounting substrates opposite a target made from the material to be evaporated and an electron-gun turned towards said target, means for modulating said electron-beam in intensity on an "on-off" basis, and a screen opaque to X-rays, said screen being integral with driving means adapted to place said screen between said target and said substrates during those "on" time-intervals when there is a beam and retracts said screen during those "off" time-intervals when there is no beam.

4. A device of deposition through vacuum evaporation, said device comprising, in a vacuum enclosure, means for mounting substrates opposite a target made from said material to be evaporated; an electron-gun turned towards said target; means for modulating said beam in position; said beam having a scanning impact area on said target and a screen opaque to X-rays, said screen being integral with a driving means which permanently places said screen between said impact area and said substrates.

* * * * *